(12) United States Patent
Bader et al.

(10) Patent No.: US 7,005,681 B2
(45) Date of Patent: Feb. 28, 2006

(54) RADIATION-EMITTING SEMICONDUCTOR COMPONENT AND METHOD FOR MAKING SAME

(75) Inventors: Stefan Bader, Regensburg (DE); Viorel Dumitru, Stuttgart (DE); Volker Härle, Waldetzenberg (DE); Bertram Kuhn, Stuttgart (DE); Alfred Lell, Maxhütte-Haidhoff (DE); Jürgen Off, Fellbach (DE); Ferdinand Scholz, Ulm (DE); Heinz Schweizer, Stuttgart (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/488,489

(22) PCT Filed: Aug. 30, 2002

(86) PCT No.: PCT/DE02/03199

§ 371 (c)(1),
(2), (4) Date: Aug. 16, 2004

(87) PCT Pub. No.: WO03/026029

PCT Pub. Date: Mar. 27, 2003

(65) Prior Publication Data

US 2004/0259299 A1    Dec. 23, 2004

(30) Foreign Application Priority Data

Aug. 30, 2001 (DE) ............................... 101 42 338
Aug. 31, 2001 (DE) ............................... 101 42 653

(51) Int. Cl.
*H10L 33/00* (2006.01)

(52) U.S. Cl. ........................ 257/94; 257/96; 257/98; 257/103; 438/22; 438/46; 438/47; 438/36; 438/37

(58) Field of Classification Search ........ 257/103–101, 257/98–99, 22; 438/22, 46–47
See application file for complete search history.

(56) References Cited

U.S. PATENT DOCUMENTS

| 5,959,307 | A |   | 9/1999 | Nakamura et al. |
| 6,067,309 | A | * | 5/2000 | Onomura et al. ............. 372/46 |
| 6,078,064 | A |   | 6/2000 | Ming-Jiunn et al. |
| 6,489,636 | B1 | * | 12/2002 | Goetz et al. .................. 257/94 |
| 6,492,660 | B1 | * | 12/2002 | Uchida ........................ 257/79 |

FOREIGN PATENT DOCUMENTS

| EP | 0 723 303 A2 | 7/1996 |
| EP | 0 977 279 A2 | 2/2000 |
| GB | 2 344 461 A | 6/2000 |
| GB | 2 344 461 A | 6/2000 |
| JP | 06-196757 | 7/1994 |
| JP | 10-022586 A | 1/1998 |
| JP | 11-243251 A | 9/1999 |
| JP | 11-340505 A | 10/1999 |

OTHER PUBLICATIONS

S. Nakamura, "UV/Blue/Green InGaN-Based LEDs and Laser Diodes Grown on Epitaxially Laterally Overgrown GaN", IEICE Trans Electron., vol. E83-C, No. 4, Apr. 2000, pp. 529-535.

Härle et al., "GaN-Based LEDs and Laser on SiC", Phys. Stat. Sol. (a) 180, 5 (2000).

* cited by examiner

*Primary Examiner*—Dung A. Le
(74) *Attorney, Agent, or Firm*—Cohen, Pontani, Lieberman & Pavane

(57) ABSTRACT

A radiation-emitting semiconductor component having a semiconductor body (1), which has a radiation-generating active layer (9) and a p-conducting contact layer (2), which contains InGaN or AlInGaN and to which a contact metalization (3) is applied.

27 Claims, 2 Drawing Sheets

RADIATION-EMITTING SEMICONDUCTOR COMPONENT AND METHOD FOR MAKING SAME

RELATED APPLICATIONS

This is a U.S. national stage of application No. PCT/DE02/03199, filed on Aug. 30, 2002.

This patent application claims priority of German patent applications Nos. 101 42 338.1 filed Aug. 30, 2001, and 101 42 653.4 filed Aug. 31, 2001, the disclosure content of which is hereby incorporated by reference.

FIELD OF THE INVENTION

The invention is related to a radiation-emitting semiconductor component having a semiconductor body, which has a radiation-generating active layer and a p-conducting contact layer, a contact metalization being applied to the p-conducting contact layer, and also a method for producing such a radiation-emitting semiconductor component.

BACKGROUND OF THE INVENTION

Radiation-emitting semiconductor components of the type mentioned have a semiconductor body with a p-conducting side and an n-conducting side, which are in each case connected to a contact area. The contact areas are generally formed as metal areas to which, by way of example, a wire connection can be connected or by which the semiconductor body can be mounted onto a chip pad. During operation, an operating current is impressed into the component via the wire connection or the chip pad. A highly doped contact layer, to which the contact area is applied in the form of a contact metalization, is usually provided in the semiconductor body.

In the case of semiconductor components based on GaN, AlGaN, InGaN and/or AlInGaN, which are referred to hereinafter as "GaN-based" for short, a p-GaN contact layer is often used on the p-conducting side of the semiconductor body. A comparatively high contact resistance occurs here upon the connection of the p-conducting contact layer and the contact metalization. The electrical power dropped across the contact resistance is converted into heat loss and is no longer available for the functional operation of the component, for example for generating radiation in the case of a radiation-emitting component. In the case of GaN-based components, the proportion of the power loss dropped across the contact resistance with respect to the total electrical power may amount to 50% or more. Furthermore, the resulting heat loss leads to heating of the component, the component being at risk of damage at excessively high temperatures. Therefore, it is desirable to keep the contact resistance as low as possible. This applies in particular to laser diode components which are operated with a high current and have a high thermal sensitivity. Thus, temperature changes may lead to instabilities in the laser mode and changes in the emission wavelength. Furthermore, the laser mirrors may be damaged by excessively high temperatures, which generally results in an irreversible total failure of the laser diode.

SUMMARY OF THE INVENTION

It is an object of the present invention to provide a radiation-emitting semiconductor component with an improved contact, which, in particular, has a low contact resistance. Another object of the present invention is to provide a method for producing a component with an improved contact.

These and other objects are attained in accordance with one aspect of the present invention directed to a radiation-emitting semiconductor component having a semiconductor body, which has a radiation-generating active layer and a p-conducting contact layer. A contact metalization is applied to the p-conducting contact layer. The contact layer contains $In_xGa_{1-x}N$, where $0<x\leq 1$ or $Al_yIn_xGa_{1-x-y}N$, where $0<x\leq 1$, $0\leq y<1$, $0<x+y\leq 1$. Another aspect of the present invention is directed to a method for producing a radiation-emitting semiconductor. A semiconductor surface is provided, and a p-conducting contact layer, which contains $In_xGa_{1-x}N$, $0<x\leq 1$ or $Al_yIn_xGa_{1-x-y}N$, $0<x\leq 1$, $0<y<1$, $0<x+y\leq 1$, is applied to the semiconductor surface. A contact metalization is applied to the p-conducting contact layer.

It has been shown as part of the present invention that, surprisingly, the contact resistance is significantly lower in the case of a semiconductor component having an In-containing contact layer than in the case of a component having a p-GaN contact layer. The In content in the contact layer is preferably greater than 1 atomic % and preferably lies between about 1 atomic % and 9 atomic %, particularly preferably in a range of between 3 atomic % and 6 atomic %, in each case relative to the group III lattice sites, the limits of the range being included.

By way of example, magnesium or zinc may be used as p-type doping of the contact layer, an Mg doping having proved to be advantageous with regard to reducing the contact resistance. In particular, a higher Mg concentration can be formed in the case of the invention than in the case of a p-GaN layer according to the prior art.

In this case, it must be taken into account that the maximum Mg concentration is limited, inter alia, by self-compensation effects which predominate, starting from a certain concentration, in such a way that a further increase in the Mg concentration is not expedient since this does not effect a further increase in the charge carrier density. For p-GaN, this maximum concentration is about $5 \cdot 10^{19}$ cm$^{-3}$. In the case of the invention, by contrast, the Mg concentration can be increased to more than $2 \cdot 10^{20}$ cm$^{-3}$.

As the contact metalization, a PdAu or NiAu layer is preferably formed on the contact layer. Other metals such as platinum, for example, are also suitable as the contact metalization. For a PdAu or NiAu contact metalization, it is preferably the case that firstly a Pd or Ni layer, respectively, is vapor-deposited onto the contact layer and an Au layer is vapor-deposited onto said Pd or Ni layer. The metal layers are subsequently alloyed. The alloying of the metal layers is typically effected at temperatures of between 200° C. and 1000° C., preferably between 200° C. and 800° C., since the risk of damage to the semiconductor layers increases at temperatures above 800° C.

Generally, it has proved to be advantageous, surprisingly, to form the p-conducting contact layer in such a way that it has a defect density that is as large as possible. In this case, defects are to be understood to be, in particular, threadlike defects such as threadlike dislocations (i.e. disturbances of the crystal lattice that occur in a correlated way along a line). The defect density of p-GaN contact layers according to the prior art is typically of the order of magnitude of $10^9$ cm$^{-2}$. It has been shown in the case of the invention that higher defect densities, for example of the order of magnitude of $5 \cdot 10^9$ cm$^{-2}$ to $5 \cdot 10^{10}$ cm$^{-2}$, lead to a lower contact resistance.

In the case of a method according to the invention for producing a radiation-emitting component, firstly a p-conducting In-containing GaN-based contact layer is applied on a semiconductor body, in which an active radiation-generating layer is formed, and a contact metalization is subsequently formed on said contact layer.

The p-conducting contact layer is preferably grown epitaxially. In this case, it has proved to be advantageous to carry out the epitaxy at a comparatively low temperature. p-GaN contact layers are usually grown at about 1000° C. according to the prior art. It has been shown that the contact resistance can be lowered by growing the contact layer at a lower temperature, for example at 800° C. or 770° C. Preferably, in the case of the invention, the contact layer is deposited epitaxially at a temperature in the range of between 700° C. and 950° C., particularly preferably between 750° C. and 850° C.

Furthermore, in order to reduce the contact resistance, it is advantageous to use nitrogen as a carrier gas during the epitaxy of the contact layer.

BRIEF DESCRIPTION OF THE DRAWINGS

Further features, advantages and expediences of the invention are explained in more detail below using four exemplary embodiments in conjunction with FIGS. 1 and 4 in which.

DETAILED DESCRIPTION OF THE INVENTION

Identical or identically acting elements are provided with the same reference symbols in the Figures.

Figure 1:
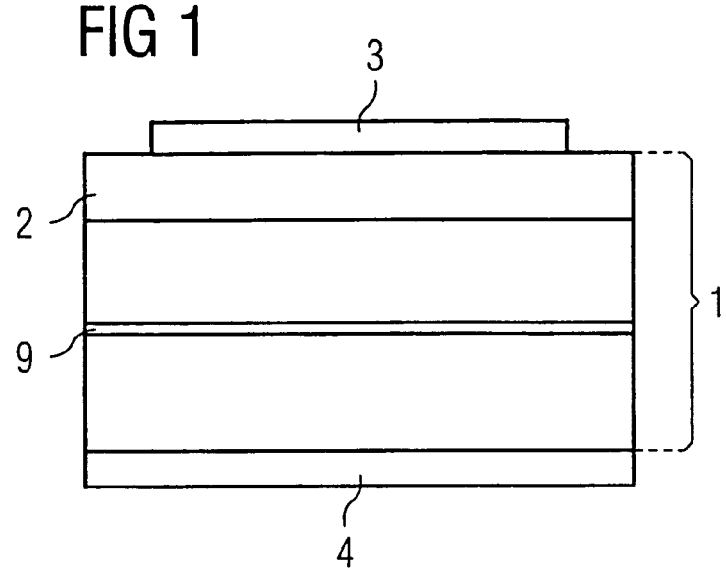
FIG. 1 shows a diagrammatic sectional illustration of a first exemplary embodiment of a semiconductor component according to the invention.

The semiconductor component illustrated in FIG. 1 has a GaN-based semiconductor body 1 with a p-conducting side and an n-conducting side and also an active radiation-generating layer 9. A contact metalization 3 is applied on a main area on the p-conducting side, and a further contact metalization 4 is applied as counter-contact oppositely on a main area of the n-conducting side. In the case of GaN-based semiconductor bodies, the n-side contact resistance is generally significantly lower than the p-side contact resistance. Since the contact resistances are connected in series via the intervening semiconductor body, it is necessary, in particular, in order to lower the total contact resistance, to reduce the contact resistance on the p-conducting side.

For this purpose, in the case of the invention, a p-conducting InGaN or AlInGaN contact layer 2 bounding the semiconductor body 1 is formed on the p-conducting side of the semiconductor body. The In content preferably lies between 1 atomic % and 9 atomic %, particularly preferably between 3 atomic % and 6 atomic %, in each case relative to the group III lattice sites. By way of example, a PdAu alloy serves as the contact metalization 3. For this purpose, firstly a Pd layer is vapor-deposited onto the p-conducting InGaN or AlInGaN contact layer 2 and an Au layer is vapor-deposited onto said Pd layer, and said layers are subsequently converted into a PdAu alloy at an elevated temperature. The p-side contact resistance is significantly lower in the case of this exemplary embodiment than in the case of a corresponding arrangement of a contact metalization on an indium-free p-GaN contact layer according to the prior art.

In order to decrease the contact resistance further, it is advantageous during the production of the semiconductor body by means of an epitaxy method to grow the contact layer 2 at a comparatively low temperature of about 800° C. and/or to use nitrogen as a carrier gas during the deposition of the p-conducting contact layer. This produces a comparatively high density of defects, in particular threadlike dislocations, in the p-conducting contact layer, which is typically $10^{10}$ cm$^{-2}$ and is thus about a factor of 10 greater than the defect density of a conventional contact layer. This brings about an advantageous decrease in the contact resistance.

Figure 2:
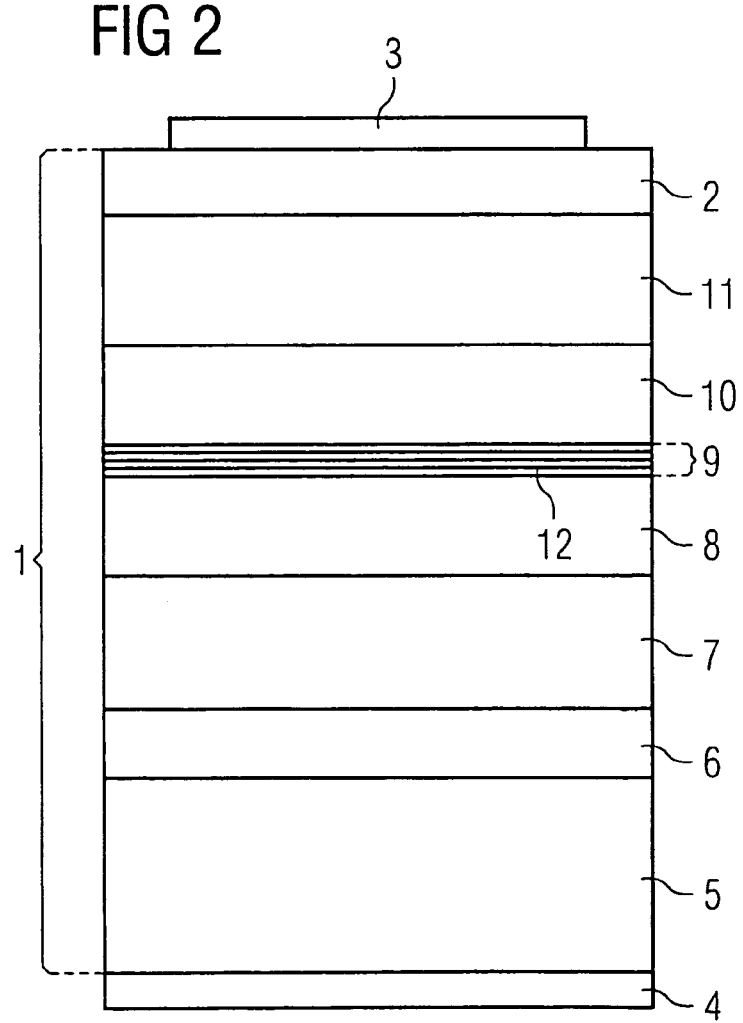
FIG. 2 shows a diagrammatic sectional illustration of a second exemplary embodiment of a semiconductor component according to the invention.

FIG. 2 shows a further exemplary embodiment of a semiconductor component according to the invention. In this case, the semiconductor body 1 is structured as a semiconductor laser. On a substrate 5, for example an SiC substrate, there are applied an n-conducting first cladding layer 7, an n-conducting first waveguide layer 8, an active layer 9, a p-conducting second waveguide layer 10, a p-conducting second cladding layer 11 and a p-conducting InGaN contact layer 2. The p-conducting contact layer 2 is provided with a contact metalization 3. A buffer layer 6 is preferably formed between the substrate 5 and the first cladding layer 7, said buffer layer serving to compensate for the different lattice constants of the substrate and the semiconductor layers of the semiconductor laser structure.

In the exemplary embodiment, the substrate is understood as being part of the semiconductor body, in which case the substrate itself, in contrast to the layers applied thereon, may also be composed of a material which is not a semiconductor. Thus, the semiconductor body 1 may also contain a different substrate, such as a sapphire substrate, for example. However, it would not make sense to arrange counter-contact 4 on such an electrically nonconductive substrate. Instead, the counter-contact would have to be arranged such as to have an electrically conductive connection between the counter-contact and the semiconductor body. This could be done, for example, by arranging the counter-contact directly on the surface of buffer layer 6 shown in FIG. 2. Such an altered arrangement of the counter-contact 4 is not illustrated.

By way of example, the first and second cladding layers may comprise AlGaN, and the first and second waveguide layers may comprise GaN. In order to form the n-type conduction, the first cladding layer 7 and the first waveguide layer 8 are Si-doped. The p-type conduction in the second cladding layer 11 and the second waveguide layer 10 is achieved by Mg doping.

The active layer 9 comprises a plurality of quantum films 12, which may be formed for example from a sequence of thin InGaN and GaN layers. More widely, the quantum films may also contain AlGaN or AlInGaN.

In particular, a PdAu alloy or an NiAu alloy is again suitable as the contact metalization, which alloy may be produced as in the case of the first exemplary embodiment. However, other contact metalizations, for example a Pt layer, may also be used in the case of the invention.

Figure 3:
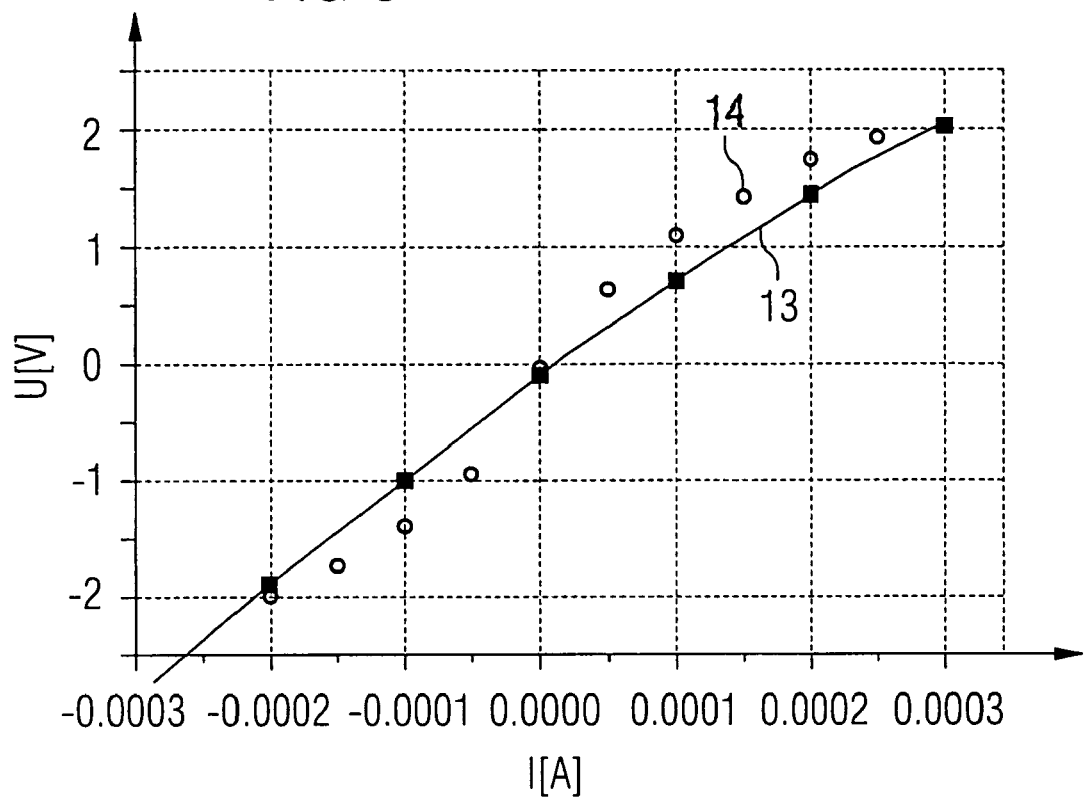
FIG. 3 shows a diagrammatic illustration of an I/U characteristic curve of a third exemplary embodiment of a semiconductor component according to the invention in comparison with an I/U characteristic curve of a component according to the prior art.

FIG. 3 illustrates one I/U characteristic curve of an exemplary embodiment of a component according to the invention in comparison with an I/U characteristic curve of a component according to the prior art. The voltage U across the component is plotted as a function of a current I impressed into the component. The line 13 or the associated measurement points represent the measurement results of the component according to the invention, and the measurement points 14 represent the corresponding results according to the prior art.

In this case, the structure of the components essentially corresponds to FIG. 2. Specifically, a 100 nm thick buffer layer 6 made of $Al_{0.2}Ga_{0.8}N$, a 500 nm thick first cladding layer 7 made of $Al_{0.09}Ga_{0.91}N$, a 100 nm thick first waveguide layer 8 made of GaN, an active layer 9, a 126 nm thick second waveguide layer 10 made of GaN and a 400 nm thick second cladding layer 11 made of $Al_{0.1}Ga_{0.9}N$ were applied to an SiC substrate 5. The buffer layer 6, the first cladding layer 7 and the first waveguide layer 8 are Si-doped and correspondingly n-conducting, and the second waveguide layer 10 and the second cladding layer 11 are Mg-doped and therefore p-conducting.

The active layer 9 comprises a quantum film structure which specifically comprises, in the direction of the contact layer, a 3 nm thick InGaN layer, a 5 nm thick GaN barrier layer, a 3 nm thick InGaN layer, a 5 nm thick GaN barrier layer, a 3 nm thick InGaN layer and a 15 nm thick, Mg-doped $Al_{0.09}Ga_{0.91}N$ barrier layer.

In the case of the component according to the invention, a 100 nm thick, Mg-doped contact layer 2 made of InGaN with an indium proportion of 3% is deposited onto the second cladding layer 11, said layer having been grown epitaxially at a comparatively low temperature of 800° C. In the case of the component according to the prior art, for comparison, a 100 nm thick p-GaN contact layer was applied epitaxially at 1000° C. As the contact metalization, a Pd layer having a thickness of 50 nm and an Au layer having a thickness of 100 nm were in each case vapor-deposited onto the contact layer 2 and subsequently alloyed.

The contacts were embodied as so-called CTLM contacts (CTLM: circular transmission line method) in order to measure the I/U characteristic curve. The I/U characteristic curve of a circular contact with a diameter of 310 µm with respect to a large-area contact was measured, the contacts being separated by a 45 µm wide ring.

As emerges from FIG. 3, the I/U characteristic curve is significantly more linear in the case of the component according to the invention than in the case of the component according to the prior art. The contact in the case of the component according to the invention therefore advantageously has a better ohmic behavior (i.e. comes closer to the linear relationship between voltage and current as expressed by the equation R=U/I). Moreover, particularly in the vicinity of the zero point (I=0A, U=0V), both the absolute resistance U/I and the differential resistance dU/dI are lower than in the case of the component according to the prior art.

Figure 4:
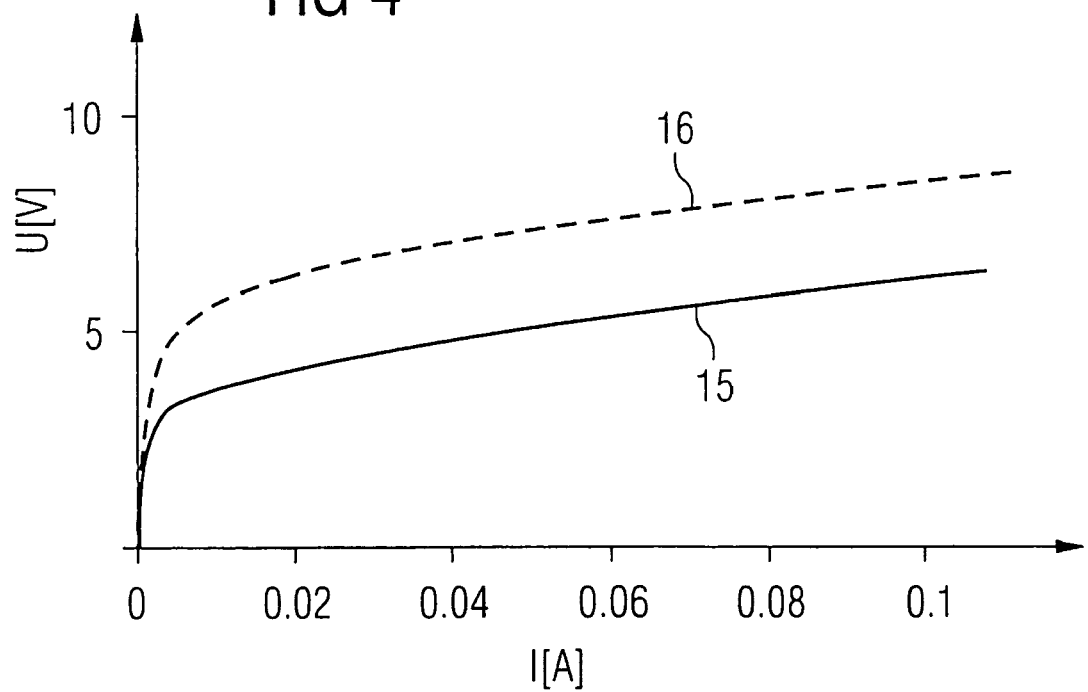
FIG. 4 shows a diagrammatic illustration of an I/U characteristic curve of a fourth exemplary embodiment of a semiconductor component according to the invention in comparison with an I/U characteristic curve of a component according to the prior art.

FIG. 4 illustrates the I/U characteristic curves of similar components. In contrast to the previously described exemplary embodiment, a contact metalization 3 having a lateral size of 750 µm×50 µm is applied in each case on the contact layer 2. On the side remote from the semiconductor layer sequence, the substrate 5 is provided with a counter-contact 4 over the whole area, and the lateral sample size is typically 3 mm×3 mm. The rest of the construction and, in particular, the composition and production of the contact layer correspond to the previously described exemplary embodiment.

The associated I/U characteristic curves are illustrated in FIG. 4. Line 15 represents the measured values for the component according to the invention with an InGaN contact layer, and line 16 represents the measured values for the component according to the prior art with a p-GaN contact layer. Both characteristic curves have a steep rise in the vicinity of the zero point, followed by a significantly shallower profile as the current rises. In this second, shallower section, the voltage U that is present with respect to a specific current I is significantly lower in the case of the component according to the invention than in the case of the component according to the prior art. Consequently, the component according to the invention has a significantly lower absolute resistance U/I in this region.

The explanation of the invention on the basis of the exemplary embodiments described does not, of course, constitute a restriction of the invention thereto. The invention relates to radiation-emitting components such as, for example, light-emitting diodes (LEDs) and laser diodes, but is generally also suitable for other GaN-based components.

The scope of the invention is not limited to the examples given hereinabove. The invention is embodied in each novel characteristic and each combination of characteristics, which includes every combination of any features which are stated in the claims, even if this combination of features is not explicitly stated in the claims.

What is claimed is:

1. A radiation-emitting semiconductor component having a semiconductor body, which has a radiation-generating active layer and a p-conducting contact layer, a contact metalization being applied to the p-conducting contact layer, wherein the contact layer has a defect density which is greater than or equal to $5 \cdot 10^9$ cm$^{-2}$ and contains $In_xGa_{1-x}N$, $0<x\leq1$ or $Al_yIn_xGa_{1-x-y}N$, $0<x<1$, $0<y<1$, $0<x+y\leq1$.

2. The radiation-emitting semiconductor component as claimed in claim 1, wherein the contact layer is doped with magnesium.

3. The radiation-emitting semiconductor component as claimed in claim 1, wherein a proportion of indium in the contact layer is greater than or equal to 1 atomic % relative to group III lattice sites.

4. The radiation-emitting semiconductor component as claimed in claim 3, wherein a proportion of indium in the contact layer is between 1 atomic % and 9 atomic %, inclusive, relative to group III lattice sites.

5. The radiation-emitting semiconductor component as claimed in claim 3, wherein a proportion of indium in the contact layer is between 3 atomic % and 6 atomic %, inclusive, relative to group III lattice sites.

6. The radiation-emitting semiconductor component as claimed in claim 1, wherein the contact metalization contains at least one of the elements Pd, Ni, Au or Pt or an alloy of at least two of said elements.

7. The radiation-emitting semiconductor component as claimed in claim 1, wherein a thickness of the contact layer is between 0.01 µm and 1.0 µm, inclusive.

8. The radiation-emitting semiconductor component as claimed in claim 5, wherein a thickness of said contact layer is between 0.1 µm and 0.2 µm, inclusive.

9. The radiation-emitting semiconductor component as claimed in claim 1, wherein the semiconductor body has a semiconductor layer sequence in which an n-conducting first cladding layer, an n-conducting first waveguide layer, an active layer, a p-conducting second waveguide layer, a p-conducting second cladding layer and the contact layer are arranged in order in a direction of the contact metalization.

10. The radiation-emitting semiconductor component as claimed in claim 9, wherein the first cladding layer contains n-AlGaN and the second cladding layer contains p-AlGaN.

11. The radiation-emitting semiconductor component as claimed in claim 9, wherein the first waveguide layer contains n-GaN and the second waveguide layer contains p-GaN.

12. The radiation-emitting semiconductor component as claimed in claim 1, wherein the active layer comprises at least one quantum film containing $In_xGa_{1-x}N$, $0 \leq x \leq 1$ or $Al_yIn_xGa_{1-x-y}N$, $0 \leq x \leq 1$, $0 \leq y \leq 1$, $0 \leq x+y \leq 1$.

13. The radiation-emitting semiconductor component as claimed in claim 1, wherein the semiconductor body has a substrate on a side which is remote from the contact layer.

14. The radiation-emitting semiconductor component as claimed in claim 13, wherein the substrate contains SiC.

15. The radiation-emitting semiconductor component as claimed in claim 13, wherein the substrate contains saphire.

16. The radiation-emitting semiconductor component as claimed in claim 13, wherein the semiconductor body contains a buffer layer adjoining the substrate.

17. The radiation-emitting semiconductor component as claimed in claim 1, wherein the component is a luminescence diode.

18. The radiation-emitting semiconductor component as claimed in claim 17, wherein the luminescence diode is one of a laser diode and an LED.

19. The radiation-emitting semiconductor component as claimed in claim 1, wherein the contact layer has a defect density which is greater than or equal to $1 \cdot 10^{10}$ cm$^{-2}$.

20. A method for producing a radiation-emitting semiconductor component, comprising:
   a) providing a semiconductor surface;
   b) applying a p-conducting contact layer (2), which contains $In_xGa_{1-x}N$, $0 < x \leq 1$ or $Al_yIn_xGa_{1-x-y}N$, $0 < x < 1$, $0 < y < 1$, $0 < x+y \leq 1$, to the semiconductor surface, wherein said contact layer has a defect density which is greater than or equal to $5 \cdot 10^9$ cm$^{-2}$; and
   c) applying a contact metalization to the p-conducting contact layer.

21. The method as claimed in claim 20, wherein said step of providing a semiconductor surface comprises epitaxially depositing a plurality of semiconductor layers on a substrate, so that a surface of the semiconductor layer deposited last forms said semiconductor surface.

22. The method as claimed in claim 20, wherein in step b), the p-conducting contact layer is deposited epitaxially on said semiconductor surface.

23. The method as claimed in claim 22, wherein in step b), the contact layer is deposited at a temperature of between 700° C. and 1000° C.

24. The method as claimed in claim 23, wherein in step b), the contact layer is deposited at a temperature of between 750° C. and 850° C.

25. The method as claimed in claim 22, wherein nitrogen is used as a carrier gas during deposition of the contact layer.

26. A radiation-emitting semiconductor component having a semiconductor body, which has a radiation-generating active layer and a p-conducting contact layer, a contact metalization being applied to the p-conducting contact layer, wherein the contact layer contains $In_xGa_{1-x}N$, $0 < x \leq 1$ or $Al_yIn_xGa_{1-x-y}N$, $0 < x < 1$, $0 < y < 1$, $0 < x+y \leq 1$ and a proportion of indium in the contact layer is between 1 atomic % and 9 atomic %, inclusive, relative to group III lattice sites.

27. The radiation-emitting semiconductor component as claimed in claim 26, wherein a proportion of indium in the contact layer is between 3 atomic % and 6 atomic %, inclusive, relative to group III lattice sites.

* * * * *

UNITED STATES PATENT AND TRADEMARK OFFICE
CERTIFICATE OF CORRECTION

PATENT NO. : 7,005,681 B2  
APPLICATION NO. : 10/488489  
DATED : February 28, 2006  
INVENTOR(S) : Stefan Bader et al.

It is certified that error appears in the above-identified patent and that said Letters Patent is hereby corrected as shown below:

Col. 2, line 51, replace the expression "200° C." with -- 200° C --

Col. 2, line 52, repalce the expression "1000° C., preferably between 200° C. and 800 C°.," with -- 1000° C, preferably between 200° C and 800° C, --

Col. 3, line 8, replace the expression "1000° C." with -- 1000° C --

Col. 3, line 11, replace the expression "800° C." with -- 800° C --

Col. 3, line 14, replace the expression "700° C. and 950° C." with -- 700° C and 950° C --

Col. 3, line 15, replace the expression "750° C." with -- 750° C --

Col. 6, line 59, replace the expression "claimed in claim 5" with -- claimed in claim 7 --

--Col. 7, line 30, replace the expression "$1.10^{10}$ cm$^{-2}$" with -- $1 \cdot 10^{10}$ cm$^{-2}$ --

Col. 8, line 16, replace the expression "700° C." with -- 700° C --

Col. 8, line 19, replace the expression "750° C." with -- 750° C --

Signed and Sealed this

Thirtieth Day of January, 2007

JON W. DUDAS  
*Director of the United States Patent and Trademark Office*